(12) United States Patent
Chen

(10) Patent No.: US 10,917,075 B2
(45) Date of Patent: Feb. 9, 2021

(54) OSCILLATOR APPARATUS CAPABLE OF PROTECTING CIRCUIT ELEMENT(S) WITHIN OSCILLATOR OF OSCILLATOR APPARATUS FROM DAMAGE OF SIGNAL GLITCH

(71) Applicant: Silicon Motion Inc., Hsinchu County (TW)

(72) Inventor: Sheng-Yi Chen, Taipei (TW)

(73) Assignee: Silicon Motion, Inc., Hsinchu County (TW)

( * ) Notice: Subject to any disclaimer, the term of this patent is extended or adjusted under 35 U.S.C. 154(b) by 0 days.

(21) Appl. No.: 16/278,196

(22) Filed: Feb. 18, 2019

(65) Prior Publication Data

US 2020/0044630 A1    Feb. 6, 2020

(30) Foreign Application Priority Data

Jul. 31, 2018 (TW) .............................. 107126478 A

(51) Int. Cl.
  *H03K 3/03* (2006.01)
  *H03K 21/10* (2006.01)
(52) U.S. Cl.
  CPC .......... *H03K 3/0315* (2013.01); *H03K 21/10* (2013.01)
(58) Field of Classification Search
  CPC .......... B24B 3/242; B24B 3/24; B24B 19/04; B24B 3/06; B23C 5/10; B23C 2210/44; B23C 2210/241; B23C 2210/40; B23B 51/02; B23B 2251/44; B23B 2251/248; B23B 2251/245; B23B 2251/406; Y10T 407/1948; Y10T 408/9046; B23P 15/34; B23P 15/32; H03K 3/0315; H03K 21/10; H03K 3/013; H03B 1/04; H03B 2202/042
  USPC .......................................................... 331/57
  See application file for complete search history.

(56) References Cited

U.S. PATENT DOCUMENTS

| | | | |
|---|---|---|---|
| 5,559,458 A * | 9/1996 | Holler, Jr. ................ | H03K 3/70 327/143 |
| 5,726,677 A * | 3/1998 | Imamura .............. | G09G 3/3622 345/537 |
| 6,362,694 B1 | 3/2002 | Doberenz | |
| 6,456,679 B1 * | 9/2002 | Den Ouden ......... | H03K 3/0231 375/373 |
| 8,471,607 B1 * | 6/2013 | Pace ...................... | H03K 23/54 327/115 |
| 8,653,883 B2 | 2/2014 | Chao | |

(Continued)

FOREIGN PATENT DOCUMENTS

| | | |
|---|---|---|
| TW | 259907 | 10/1995 |
| TW | 200939633 | 9/2009 |
| TW | 201703439 A | 1/2017 |

(Continued)

*Primary Examiner* — Richard Tan
(74) *Attorney, Agent, or Firm* — Winston Hsu

(57) ABSTRACT

An oscillator apparatus includes an oscillator circuit and a protection circuit. The oscillator circuit has an input and an output for generating a clock signal. The protection circuit is coupled to the input or the output of the oscillator circuit and is used for generating a second power switch control signal to the input of the oscillator circuit according to a signal edge of the clock signal and a first power switch control signal which is provided to the oscillator apparatus, to protect circuit element(s) included within the oscillator circuit.

7 Claims, 7 Drawing Sheets

(56) References Cited

U.S. PATENT DOCUMENTS

2010/0214854 A1* 8/2010 Moon .................... G11C 19/28
365/189.14

FOREIGN PATENT DOCUMENTS

| WO | 2013/070783 A2 | 5/2013 |
| WO | 20161186756 A1 | 11/2016 |

* cited by examiner

OSCILLATOR APPARATUS CAPABLE OF PROTECTING CIRCUIT ELEMENT(S) WITHIN OSCILLATOR OF OSCILLATOR APPARATUS FROM DAMAGE OF SIGNAL GLITCH

BACKGROUND OF THE INVENTION

1. Field of the Invention

The invention relates an oscillator apparatus, and more particularly to an oscillator apparatus capable of protecting circuit element(s) within an oscillator of the oscillator apparatus.

2. Description of the Prior Art

Generally speaking, an oscillator circuit for example is a ring oscillator which can spontaneously generate an oscillation frequency, and the circuit elements within the oscillator circuit are also triggered by the signal edge(s) of such oscillation frequency. In addition, a conventional method may employ an externally triggered power switch control signal to control the oscillator circuit whether to output the spontaneously generated oscillation frequency as the clock signal. The problem of the conventional method is that it is impossible to guarantee the signal edge of the externally triggered power switch control signal is accurately aligned with the signal edge of the generated oscillation frequency. This causes that signal glitch is easily introduced into the circuit elements within the oscillator circuit due to the asynchronous between the signal edges.

SUMMARY OF THE INVENTION

Therefore one of the objectives of the invention is to provide an oscillator apparatus capable of protecting the circuit elements within its oscillator from signal glitch.

According to the embodiments, an oscillator apparatus is disclosed. The oscillator apparatus comprises an oscillator circuit and a first protection circuit. The oscillator circuit has an input terminal and an output terminal, and is configured for generating a clock signal at the output terminal. The first protection circuit is coupled to the input terminal of the oscillator circuit, and is configured for generating and outputting a second power switch control signal to the input terminal of the oscillator circuit according to a signal edge of the clock signal and a first power switch control signal provided for the oscillator apparatus, to control and protect a circuit element within the oscillator circuit to generate the clock signal.

According to the embodiments, an oscillator apparatus is disclosed. The oscillator apparatus comprises an oscillator circuit, a first AND gate, and a protection circuit. The oscillator circuit has an input terminal and an output terminal, and is configured to generate a first clock signal at the output terminal. The first AND gate has a first input terminal coupled to the output terminal of the oscillator circuit to receive the first clock signal, a second input terminal, and an output terminal. The protection circuit is coupled to the output terminal of the oscillator circuit and the second input terminal of the first AND gate, and is configured to generate and output a third power switch control signal to the second input terminal of the first AND gate according to a signal edge of the first clock signal and a first power switch control signal, to control the first AND gate to generate a second clock signal as an output clock of the oscillator apparatus. The protection circuit is further used for generating and outputting a second power switch control signal to the input terminal of the oscillator circuit according to the signal edge of the first clock signal and the first power switch control signal, to protect a circuit element within the oscillator circuit to generate the first clock signal.

These and other objectives of the present invention will no doubt become obvious to those of ordinary skill in the art after reading the following detailed description of the preferred embodiment that is illustrated in the various figures and drawings.

DETAILED DESCRIPTION

The invention aims at providing a method and apparatus capable of synchronizing the signal edge of an externally provided power switch control signal with the required clock signal edge for circuit element (s) of an internal oscillator circuit such as a ring oscillator circuit (but not limited), to solve or reduce the glitches generated due to asynchronous between the signal edge of the power switch control signal and the required clock signal edge so as to avoid operation errors and improve the signal quality of the oscillator circuit.

Figure 1:
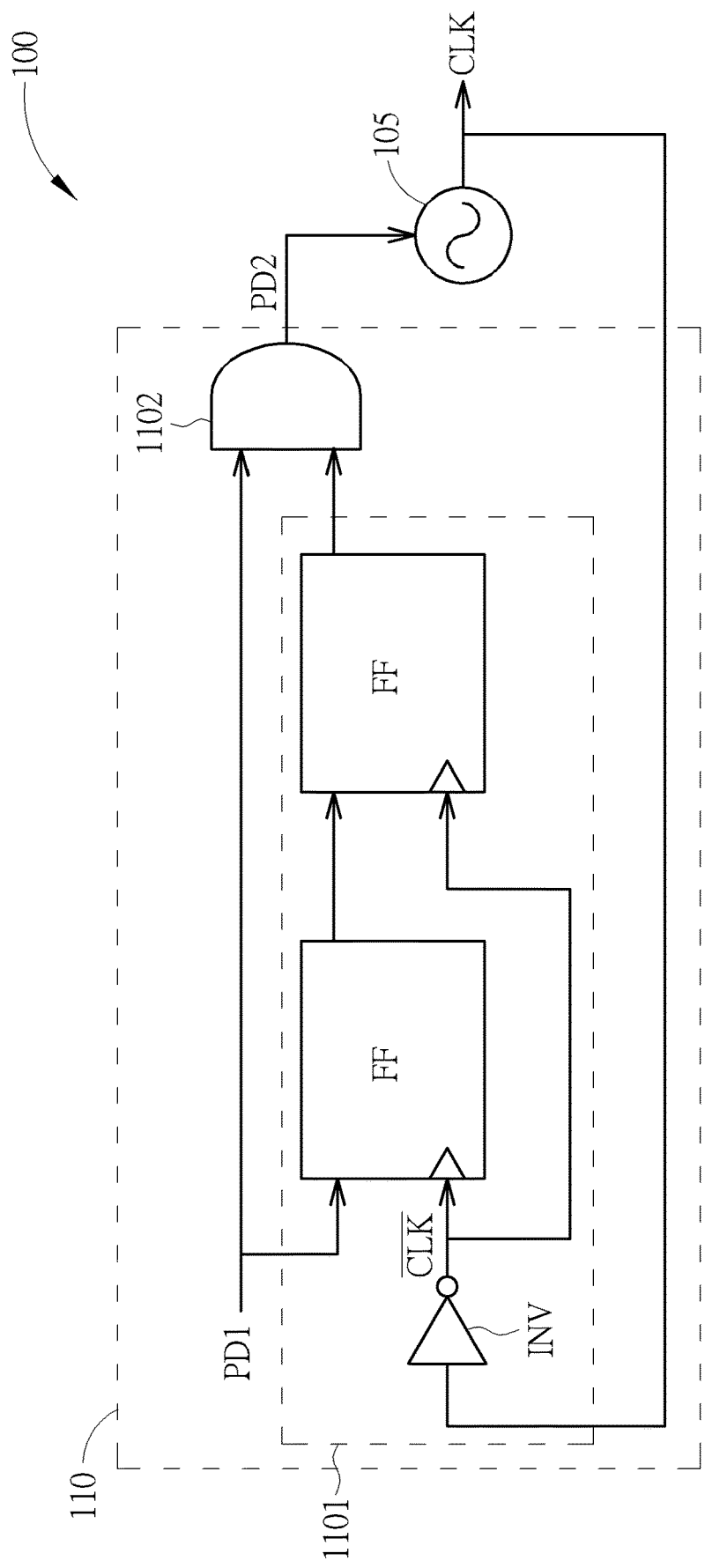
FIG. 1 is a diagram of an oscillator apparatus according to a first embodiment of the invention.

FIG. 1 is a diagram of an oscillator apparatus 100 according to a first embodiment of the invention. The oscillator apparatus 100 comprises an oscillator circuit 105 and a protection circuit 110. The oscillator circuit 105 for example is a ring oscillator circuit (but not limited) and has an input terminal and an output terminal. The oscillator circuit 105 is arranged to generate a clock signal CLK at the output terminal and to receive a power switch control signal at the input terminal. The power switch control signal is used for determine whether to generate and output the clock signal CLK at the output terminal. For example, if the oscillator circuit 105 is implemented by adopting a ring oscillator circuit to spontaneously generate clock frequency such as the clock signal CLK1 (not shown in FIG. 1), then the power switch control signal is used for determining whether to output the signal CLK1 as the clock signal CLK.

The protection circuit 110 is used as a protection circuit for power switch control. The protection circuit 110 is coupled to the input terminal of oscillator circuit 105 and used for generating and outputting the second power switch control signal PD2 to the input terminal of oscillator circuit 105 according to a signal edge of the clock signal CLK and a first power switch control signal PD1 provided to the oscillator apparatus 100, to control and protect internal circuit element(s) within oscillator circuit 105 when the oscillator circuit 105 generates the clock signal CLK.

In practice, the protection circuit 110 comprises a counting circuit 1101 and an AND gate 1102. The counting circuit 1101 for example comprises an inverter INV and a plurality of serially connected flip-flops FF. For example, in this embodiment, two serially connected flip-flops FF are employed. However, this is not intended to be a limitation. A different number of flip-flops FF may be used. The data input terminal of the first flip-flop FF is coupled to the first power switch control signal PD1. The clock input terminals of flip-flops FF are connected to the output terminal of inverter INV. The input terminal of such inverter INV is coupled to the clock signal CLK to receive the clock signal CLK. The two input terminals of the AND gate 1102 are respectively connected to the first power switch control signal PD1 and the data output terminal of the last flip-flop among the serially connected flip-flops FF. The output terminal of AND gate 1102 is connected to the input terminal of oscillator circuit 105, to provide and output the second power switch control signal PD2 to the oscillator circuit 105.

For the operation, if the oscillator circuit 105 is implemented using a ring oscillator circuit, then the oscillator circuit 105 when powered can spontaneously generate clock frequency. The first power switch control signal PD1 means a switch control signal. When the first power switch control signal PD1 switches from the low logic level into the high logic level, i.e. an occurrence of a rising edge, this indicates that it is to control the oscillator circuit 105 not to output the oscillation frequency. In addition, the first power switch control signal PD1 may be transmitted or generated by an external circuit or may be triggered by a user in other embodiments.

The inverter INV is arranged to receive the clock signal CLK actually outputted by the oscillator circuit 105 to generate another clock signal, i.e. an inverted clock signal $\overline{CLK}$. When the inverted clock signal $\overline{CLK}$ indicates a switching from the low logic level into the high logic level, i.e. equivalently the clock signal CLK indicates a switching from the high logic level into the low logic level (a falling edge of the clock signal CLK), it is arranged to control and trigger the flip-flops FF to transmit the received first power switch control signal PD1 to a next stage circuit. Thus, when the first power switch control signal PD1 indicates a switching from the low logic level into the high logic level to disable the outputting of the generated oscillation frequency, the AND gate 1102 at an input terminal receives the high logic level of the first power switch control signal PD1 and at another input terminal still receives the low logic level. Through the operations of flip-flops FF, in the embodiment, the after two falling edges (i.e. two clock cycles), the AND gate 1102 at such another input terminal receives the high logic level of first power switch control signal PD1, and in this situation the second power switch control signal PD2 generated at the output terminal of AND gate 1102 switches from the low logic level to the high logic level. In other words, the rising edge of second power switch control signal PD2 occurs and follows a plurality of clock signal cycles such as two clock cycles after a rising edge of the first power switch control signal PD1. Thus, no matter when the rising edge of first power switch control signal PD1 is generated, i.e. no matter when the request of disabling the outputting of the generated oscillation frequency is received, the request can be controlled to be sent to notify the oscillator circuit 105 after specific multiple clock cycles, to make the signal edge of second power switch control signal PD2 received by the internal circuit elements within the oscillator circuit 105 be aligned with the signal edge of the oscillation frequency generated by the oscillator circuit 105 so that the signal glitch is not introduced into the operations of the internal circuit elements within the oscillator circuit 105.

Figure 2:
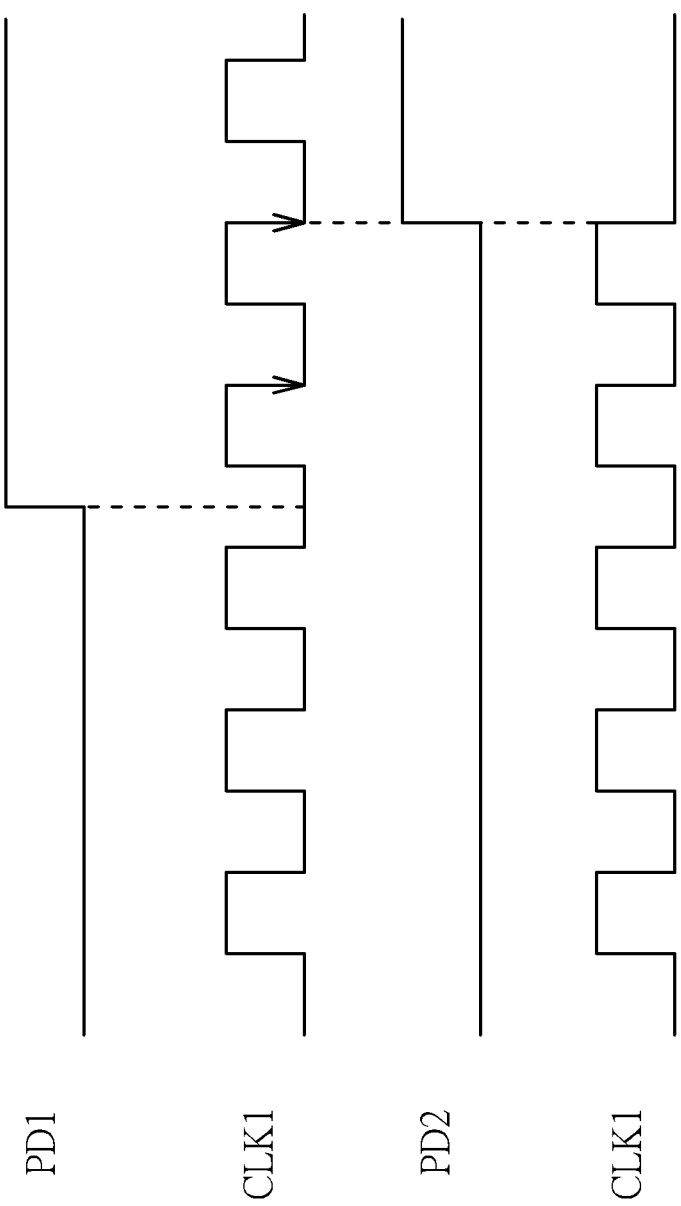
FIG. 2 is an example diagram of signal sequences of oscillator apparatus of FIG. 1.

FIG. 2 is an example diagram of the signal sequences generated by the oscillator apparatus 100 as shown in FIG. 1. PD1 is the first power switch control signal. Signal CLK1 is the oscillation frequency spontaneously generated by the internal circuit elements within the oscillator circuit 105. The rising edge of the first power switch control signal PD1 for example is not aligned with the signal edge of signal CLK1. For example, the rising edge of the first power switch control signal PD1 may occur when the signal CLK1 is at the low logic level. PD2 is the second power switch control signal which is a power switch control signal actually provided for and inputted into the oscillator circuit 105. As shown in FIG. 2, through the operations of the protection circuit 110, the second power switch control signal PD2 is not switched from the low logic level into the high logic level until two clock signal cycles following the rising edge of signal PD1. In this situation, the oscillator circuit 105 is arranged to switch to the state which does not output or stops outputting the generated oscillation frequency once it receives the high logic level of the second power switch control signal PD2, to stop outputting the oscillation frequency of clock signal CLK1. Accordingly, as shown in FIG. 2, even though the rising edge of first power switch control signal PD1 is not aligned with the signal edge of signal CLK1, the protection circuit 110 can still generate the second power switch control signal PD2 having the signal edge which is aligned with the signal edge of signal CLK1, to make the signal glitch not be introduced into the circuit elements within the oscillator circuit 105 even the first power switch control signal PD1 and signal CLK1 are received by apparatus 100.

Figure 3:
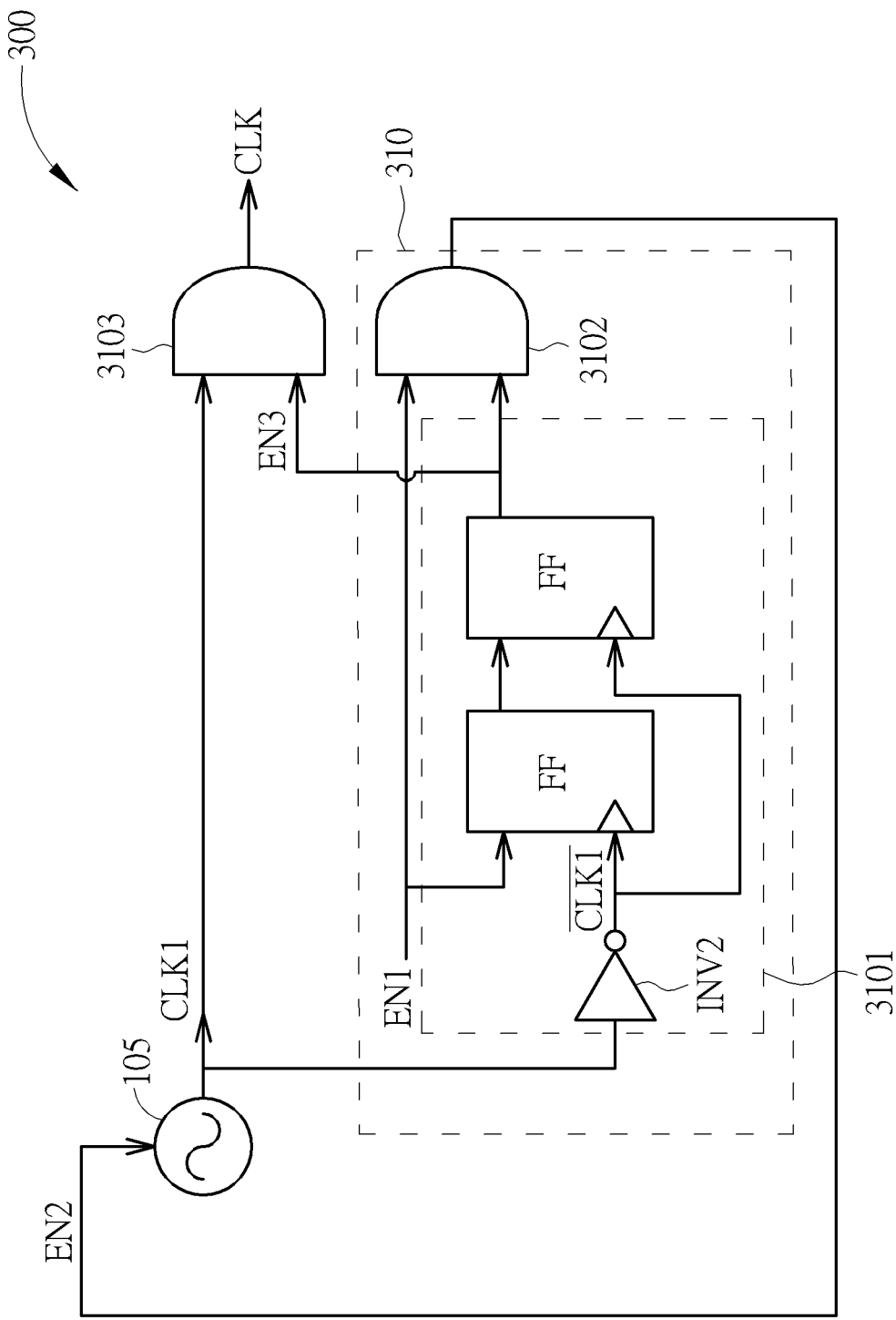
FIG. 3 is a diagram of an oscillator apparatus according to a second embodiment of the invention.

Further, the above-mentioned protection circuit is applied for the input terminal of the oscillator circuit 105. However, in other embodiments, such protection circuit can be also applied for the output terminal of oscillator circuit 105. FIG. 3 is a diagram of an oscillator apparatus 300 according to a second embodiment of the invention. The oscillator apparatus 300 comprises an oscillator circuit 105, a protection circuit 310, and an AND gate 3103. The oscillator circuit 105 for example is a ring oscillator circuit (but not limited) and has an input terminal and an output terminal. The ring oscillator circuit can spontaneously generate oscillation frequency and generate a clock signal CLK1 at its output terminal. The ring oscillator circuit is arranged to receive a power switch control signal at its input terminal to determine whether to output the generated clock signal CLK1 at its output terminal. The protection circuit 310 is a power switch protection circuit and is coupled to the output terminal of oscillator circuit 105. The protection circuit 310 is used for generating and outputting a second power switch control signal EN2 to the input terminal of oscillator circuit 105 according to a signal edge of the clock signal CLK1 and a first power switch control signal EN1 provided to the oscillator apparatus 300, to control and protect circuit elements within the oscillator circuit 105 so as to generate the clock signal CLK1. In addition, the protection circuit 310 is arranged to generate a third power switch control signal EN3 to control the clock signal CLK actually generated and outputted by the oscillator apparatus 300.

In practice, the protection circuit 310 comprises a counting circuit 3101 and an AND gate 3102. The counting circuit 3101 comprises an inverter INV2 and a plurality of serially connected flip-flops FF. For example, in this embodiment, the plurality of serially connected flip-flops FF are implemented by using two serially connected flip-flops FF; however, this is not intended to be a limitation. In other embodiments, the flip-flops FF may be implemented by using a different number of flip-flops. The data input terminal of the first flip-flop FF among the flip-flops FF is connected to the first power switch control signal EN1. All the clock input terminals of the flip-flops FF are connected to the output terminal of the inverter INV2. The input terminal of the inverter INV2 is connected to the clock signal CLK1 to receive the clock signal CLK1 to generate an inverted clock signal $\overline{CLK1}$. The two input terminals of AND gate 3102 are respectively connected to the first power switch control signal EN1 and the data output terminal of the last flip-flop among the plurality of serially connected flip-flops FF. The output terminal of AND gate 3102 is connected to the input terminal of oscillator circuit 105 to provide and output the second power switch control signal EN2 to the oscillator circuit 105.

In addition, the two input terminals of AND gate 3103 are respectively connected to the output terminal of oscillator circuit 105 to receive the clock signal CLK1 and connected to the data output terminal of the last flip-flop among the plurality of serially connected flip-flops FF. The signal generated and outputted at the output terminal of AND gate 3103 is the clock signal CLK actually generated and outputted from the oscillator apparatus 300.

For the operation, the oscillator circuit 105 is for example a ring oscillator circuit and is arranged to spontaneously generate an oscillation frequency when it is powered. The first power switch control signal EN1 means for example a power switch control signal. When the first power switch control signal EN1 is switched from the low logic level into the high logic level, i.e. the occurrence of a rising edge, this indicates that it is arranged to control the oscillator circuit 105 start to output the oscillation frequency. The first power switch control signal EN1 may be sent or generated by an external circuit or triggered by a user.

The inverter INV2 receives the clock signal CLK1 generated by the oscillator circuit 10 to generate the inverted clock signal $\overline{CLK1}$. When the inverted clock signal $\overline{CLK1}$ indicates a switching from the low logic level to the high logic level, i.e. equivalently when the clock signal CLK1 indicates a switching from the high logic level to the low logic level (i.e. a falling edge of clock signal CLK1), each of the flip-flops FF is triggered to send latched information and transmit the received first power switch control signal EN1 into a next stage circuit. Thus, when the first power switch control signal EN1 indicates a switching from the low logic level to the high logic level to start to output the generated oscillation frequency, the AND gate 3102 at an input terminal receives the high logic level of first power switch control signal EN1 and at another input terminal receives a level which is still kept at the low logic level. In this situation, the second power switch control signal EN2 generated at the output terminal of AND gate 3102 is at the low logic level. In this embodiment, for example, two flip-flops are employed to implement the flip-flops FF. Since of the operations of the two flip-flops, the AND gate 3102 at such another input terminal does not receive the high logic level of first power switch control signal EN1 until two falling edges (i.e. two clock cycles) occur. Thus, the rising edge of the second power switch control signal EN2 generated at the output terminal of AND gate 3102 is arranged to immediately follow a plurality of clock signal cycles such as two clock cycles following the rising edge of the first power switch control signal EN1. No matter when the rising edge of the first power switch control signal EN1 is generated, i.e. no matter when a request of starting to output the generated oscillation frequency, the apparatus 300 can be arranged to control and output such request to the oscillator circuit 105 after specific clock cycles following the rising edge of the first power switch control signal EN1, to make the signal edge of such request be aligned with the clock edge generated by the oscillator circuit 105 so that the signal glitch is not introduced into the circuit elements within the oscillator circuit 105.

Additionally, for the AND gate 3103, When the first power switch control signal EN1 indicates a switching from the low logic level to the high logic level to start to output the generated oscillation frequency, through the operations of the flip-flops FF, a rising edge occurs in the third power switch control signal EN3 received by another input terminal of the AND gate 3103 after two falling edges occur in the clock signal CLK1, and then the AND gate 3103 outputs the clock signal CLK1 as the clock signal CLK actually generated and outputted from the oscillator apparatus 300.

Figure 4:
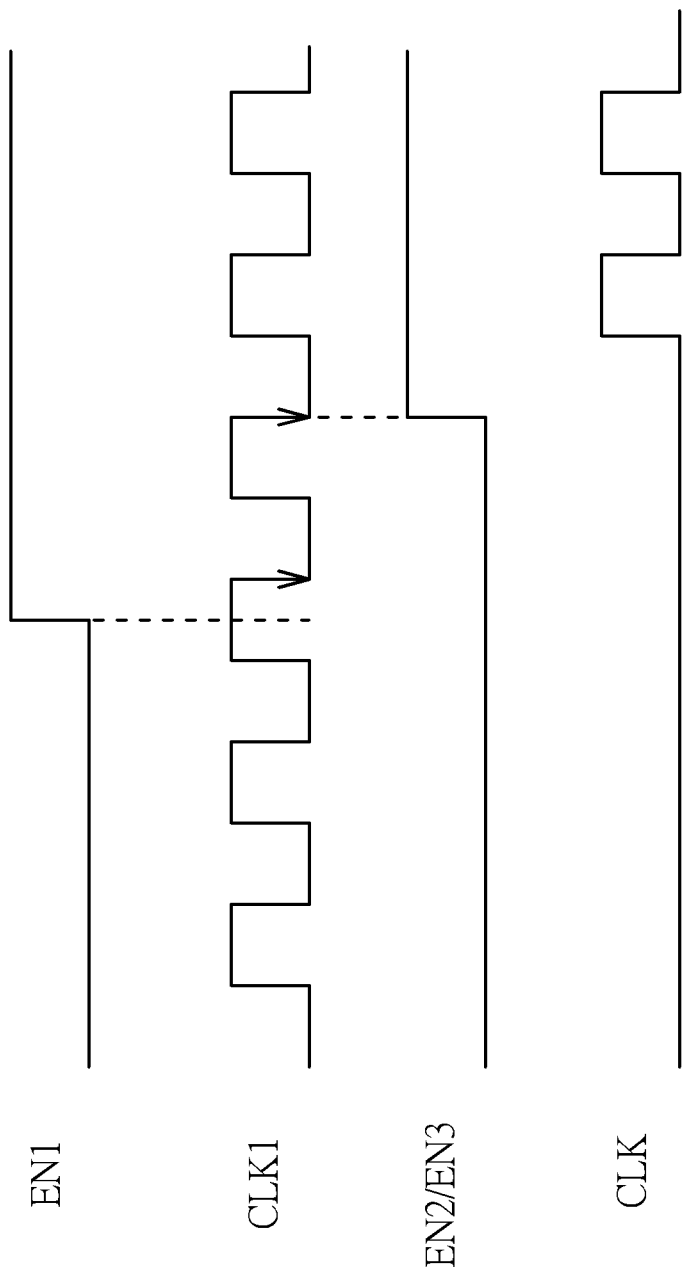
FIG. 4 is an example diagram of signal sequences of oscillator apparatus of FIG. 3.

FIG. 4 is an example diagram of signal sequences generated by the oscillator apparatus 300 as shown in FIG. 3. EN1 is the first power switch control signal, and signal CLK1 is the oscillation frequency spontaneously generated by circuit elements within the oscillator circuit 105. The rising edge of the first power switch control signal EN1 for example is not aligned with the signal edge of signal CLK1. For example, the rising edge of the first power switch control signal EN1 occurs when the signal CLK1 is at the high logic level (but not limited) as shown in FIG. 4. EN2 and EN3 are the second and third power switch control signals which are signals actually outputted to the input terminal of oscillator circuit 105 and the input terminal of AND gate 3103 respectively. Through the above operations of protection circuit 310, the second and third power switch control signals EN2 and EN3 are not switched from the low logic level to the high logic level, i.e. a rising edge does not occur, until two clock signal falling edges occur after the rising edge of signal EN1. In this situation, the oscillator circuit 105 then starts to output the generated oscillation frequency to generate the clock signal CLK actually outputted from the oscillator apparatus 300. As shown in FIG. 4, even though the rising edge of first power switch control signal EN1 is not aligned with the signal edge of clock signal CLK1, the protection circuit 110 can still generate the second and third power switch control signals EN2 and EN3 having the signal edge aligned with the signal edges of clock signal CLK1 so that the signal glitch is not introduced into the circuit elements within the oscillator circuit 105 when the oscillator circuit 105 is triggered due to the reception of second power switch control signal EN2.

Figure 5:
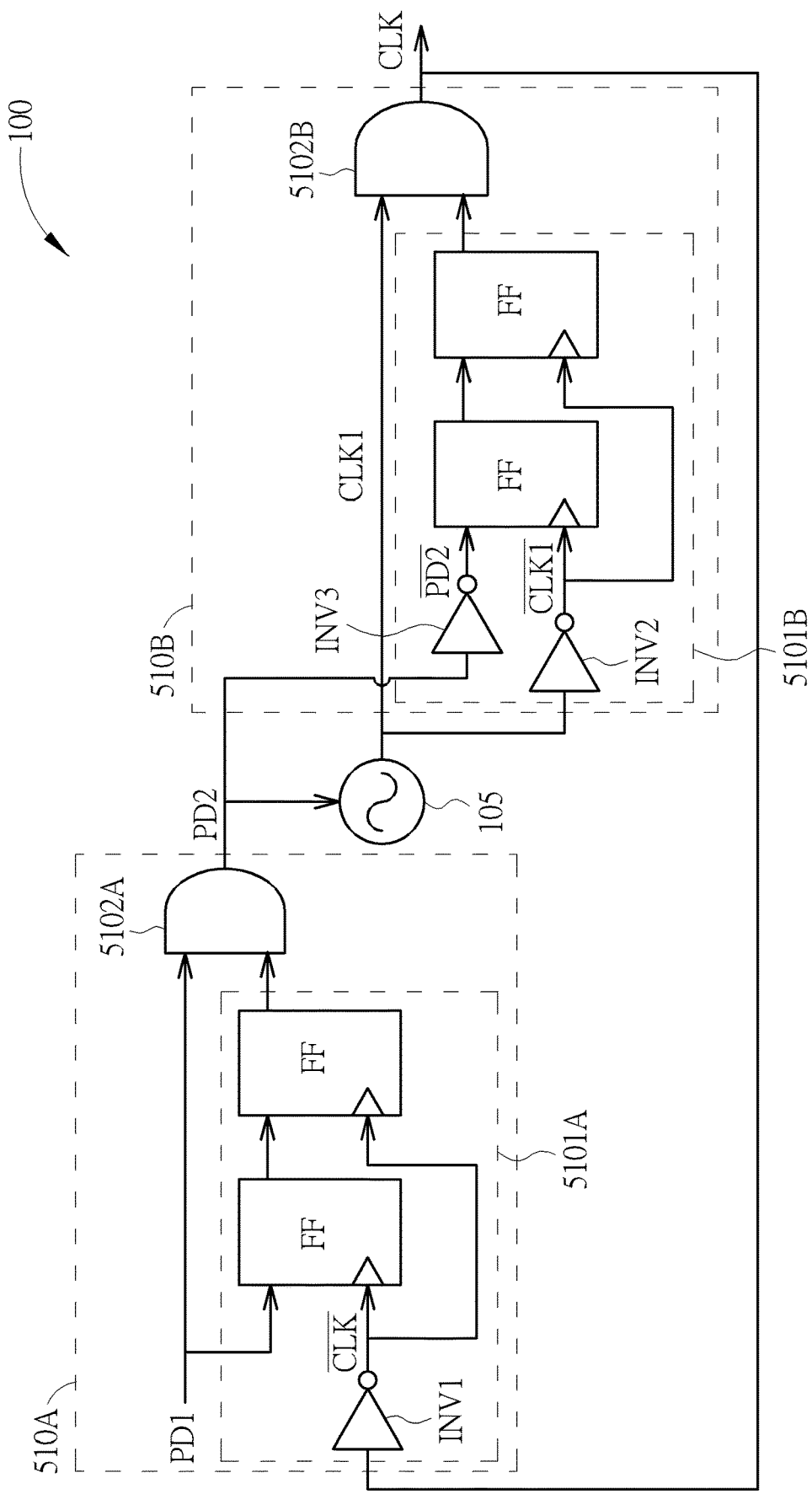
FIG. 5 is a diagram of an oscillator apparatus according to a third embodiment of the invention.

Additionally, the protection circuits shown in FIG. 1 and FIG. 3 can be combined in other embodiment to protect the circuit elements within the oscillator circuit 105 from the damage of signal glitch when the oscillator circuit 105 is triggered/activated and disabled by a power switch control signal. FIG. 5 is a diagram of an oscillator apparatus 500 according to a third embodiment of the invention. The oscillator apparatus 500 comprises an oscillator circuit 105, a protection circuit 510A, and a protection circuit 510B. The oscillator circuit 105 for example is a ring oscillator circuit (but not limited) and has an input terminal and an output terminal. The oscillator circuit 105 at its output terminal generates a clock signal CLK1 and at its input terminal receives a power switch control signal to determine whether to generate and output the clock signal CLK1 at its output terminal.

The protection circuits 510A and 510B are different and distinct power switch protection circuits. The protection circuit 510A is a power switch protection circuit which is coupled to the input terminal of oscillator circuit 105 and the output terminal of protection circuit 510B. The protection circuit 510A comprises the counting circuit 5101A and the AND gate 5102A. The counting circuit 5101A comprises the inverter INV1 and multiple serially connected flip-flops FF. The protection circuit 510B comprises the counting circuit 5101B and the AND gate 5102B. The counting circuit 5101B comprises the inverter INV2 and INV3 and multiple serially connected flip-flops FF. The detailed circuit connections are shown on FIG. 5.

For the operation, the oscillator circuit 105 for example is a ring oscillator circuit and can spontaneously generate an oscillation frequency when being powered. The first power switch control signal PD1 means a switch control signal. When the first power switch control signal PD1 is switched from the low logic level to the high logic level, i.e. a rising edge, this indicates that it is arranged to control the oscillator circuit 105 not to output such oscillation frequency (i.e. not to output the spontaneously generated clock signal). The first power switch control signal PD1 may be sent or generated by an external circuit or triggered by a user.

The inverter INV1 receives the clock signal CLK actually outputted from the oscillator apparatus 500 to generate another clock signal, i.e. the inverted clock signal $\overline{CLK}$. When the inverted clock signal $\overline{CLK}$ indicates a switching from the low logic level to the high logic level, i.e. the clock signal CLK indicates a switching from the high logic level to the low logic level (i.e. a falling edge occurs in the clock signal CLK), the flip-flops FF are controlled/triggered to send latched information and to transmit the received first power switch control signal PD1 to the next stage circuit. Thus, for the AND gate 5102A, when the first power switch control signal PD1 indicates a switching from the low logic level to the high logic level to disable the outputting of the oscillation frequency, through the operations of the flip-flops such as two flip-flops in the embodiment, the AND gate 5102A at another input terminal (i.e. the output of the last flip-flop) does not receive the rising edge of the first power switch control signal PD1 until two falling edges (i.e. two clock cycles) after the rising edge of the original first power switch control signal PD1. Thus, the rising edge of the second power switch control signal PD2 generated by the AND gate 5102A is arranged to follow a plurality of clock signal cycles such as two clock cycles after the rising edge of the first power switch control signal PD1. Thus, no matter when the rising edge of the first power switch control signal PD1 is generated, i.e. no matter when the request of disabling the outputting of the generated oscillation frequency is received, the apparatus 500 can control and does not transmit the request of disabling the outputting of the generated oscillation frequency to the oscillator circuit 105 until specific multiple clock cycles following the rising edge of the first power switch control signal PD1, to make the signal edge of the request be aligned with a signal edge of the clock generated by the oscillator circuit 105 so that the signal glitch is not introduced into the circuit elements within the oscillator circuit 105.

Additionally, the second power switch control signal PD2 can be also transmitted to the input terminal of the inverter INV3, and the inverted second power switch control signal $\overline{PD2}$ is generated at the output terminal of the inverter INV3. The inverted signal $\overline{PD2}$ equivalently can be regarded as a power switch control signal which is used to indicate to start the outputting of the generated clock signal CLK1.

The clock signal CLK1 spontaneously generated by the oscillator circuit 105 is transmitted to the input terminal of the inverter INV2. The inverted signal $\overline{CLK1}$ is generated at the output terminal of the inverter INV2. When the inverted clock signal $\overline{CLK1}$ indicates a switching from the low logic level to the high logic level, i.e. when the clock signal CLK1 indicates a switching from the high logic level to the low logic level (i.e. a falling edge occurs in the clock signal CLK1), the flip-flops of counting circuit 5101B are activated or triggered to transmit the received control signal $\overline{PD2}$ to the next stage circuit. Thus, for the AND gate 5102B, through the operations of the flip-flops FF such as two flip-flops employed in the embodiment, the AND gate 5102B does not receive the rising edge of the control signal $\overline{PD2}$ at another input terminal until two falling edges (i.e. two clock cycles) following the rising edge of the inverted clock signal $\overline{CLK1}$. Only when receiving the rising edge of control signal $\overline{PD2}$ (a switching from the low logic level to the high logic level), the AND gate 5102B is arranged to output the clock signal CLK1 spontaneously generated by the oscillator circuit 105 as the clock signal CLK actually outputted from the oscillator apparatus 500.

Figure 6:
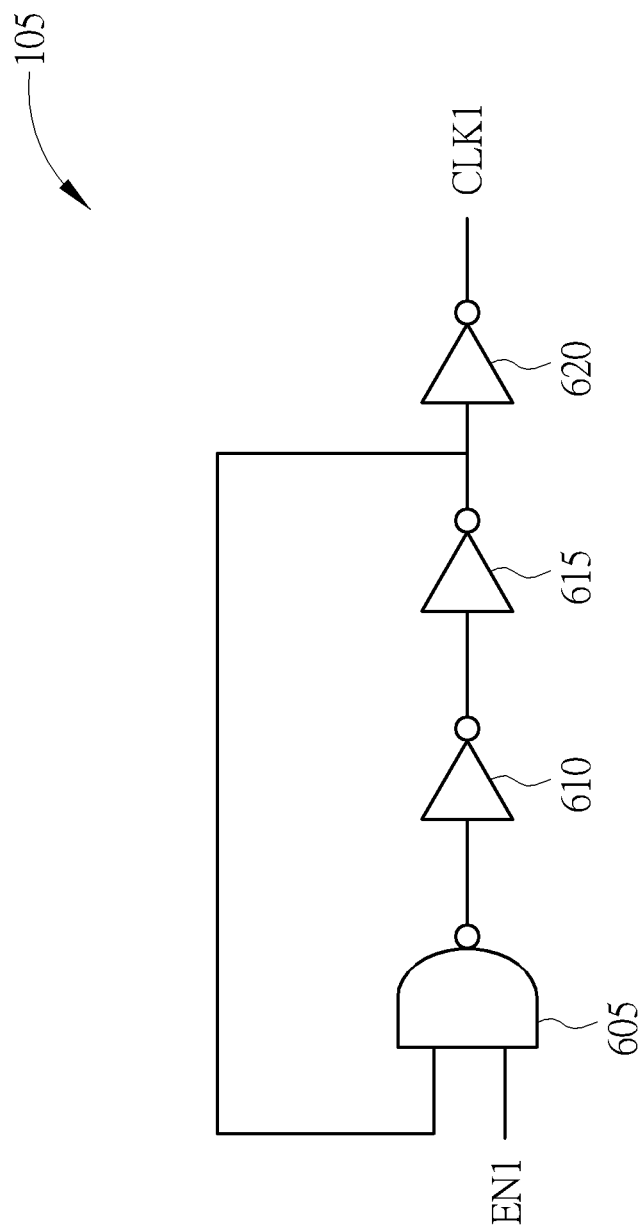
FIG. 6 is a diagram of an oscillator circuit as shown in FIG. 3 according an embodiment of the invention.
Figure 7:
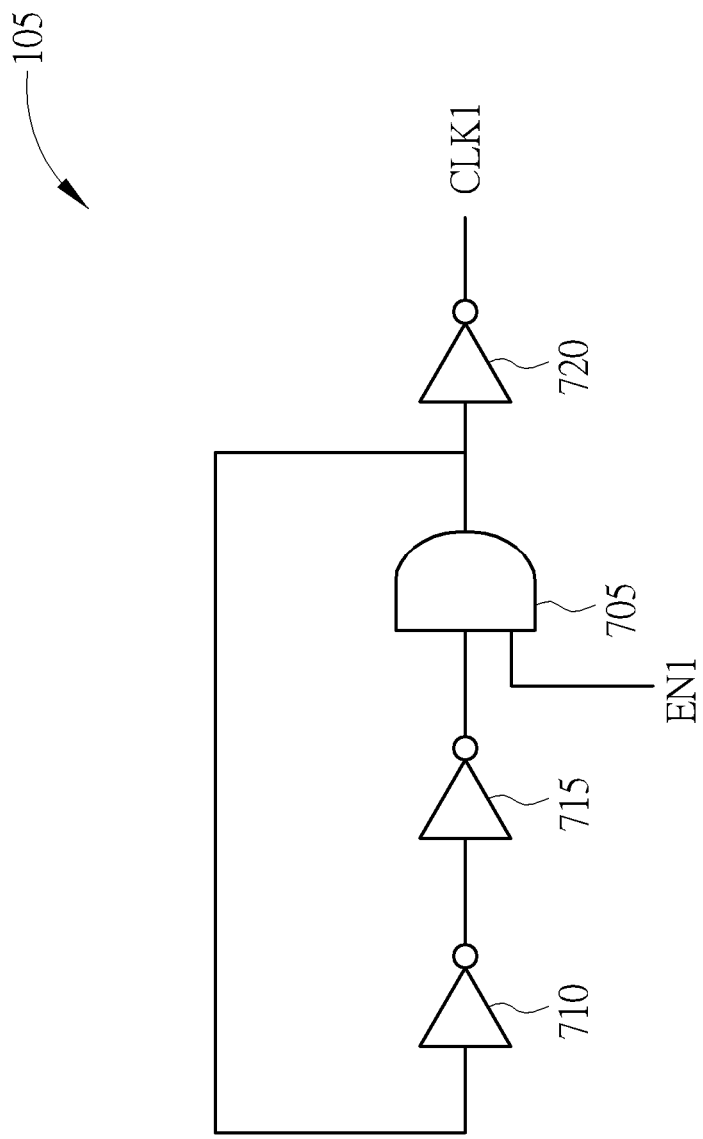
FIG. 7 is a diagram of an oscillator circuit as shown in FIG. 3 according another embodiment of the invention.

Additionally, refer to FIG. 6 in conjunction with FIG. 7. FIG. 6 and FIG. 7 are diagrams of the oscillator circuit 105 as shown in FIG. 3 according to different embodiments of the invention. As shown in FIG. 6, the oscillator circuit 105 comprises an NAND gate 605 and three inverters 610, 615, and 620. The circuit connections are illustrated on FIG. 6, and the corresponding description is not detailed for brevity. Further, as shown in FIG. 7, the oscillator circuit 105 comprises an AND gate 705 and three inverters 710, 715, and 720. The circuit connections are illustrated on FIG. 6, and the corresponding description is not detailed for brevity. Further, the oscillator circuit 105 shown in FIG. 1 can be implemented by using the circuit structure in FIG. 6 or in FIG. 7 wherein the signal EN1 on FIG. 6 or FIG. 7 is replaced by the signal PD1. Since the power switch control signal PD1 of FIG. 1 is equivalently an inverted signal of the power switch control signal EN1 shown on FIG. 3, the power switch control signal PD1 is arranged to disable or turn off the oscillator circuit 105.

Further, the above-mentioned flip-flops are configured to be clock-triggered by the falling edge(s) of the clock signal. However, in other embodiments, the above-mentioned flip-flops may be configured to be clock-triggered by the rising edge(s) of the clock signal. This modification also obeys the spirit of the invention.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. An oscillator apparatus, comprising:
   an oscillator circuit, having an input terminal and an output terminal, for generating a clock signal at the output terminal; and
   a first protection circuit, coupled to the input terminal of the oscillator circuit, for generating and outputting a second power switch control signal to the input terminal of the oscillator circuit according to a signal edge of the clock signal and a first power switch control signal provided for the oscillator apparatus, to control and protect a circuit element within the oscillator circuit to generate the clock signal;

wherein the first protection circuit comprises:
a first counting circuit, having an input terminal coupled to the first power switch control signal and an output terminal; and
a first AND gate, having two input terminals respectively coupled to the first power switch control signal and the output terminal of the first counting circuit and having an output terminal coupled to the input terminal of the oscillator circuit;
wherein when the clock signal indicates a switching from a high logic level to a low logic level, the first counting circuit is arranged to output the first power switch control signal to the first AND gate after counting a specific number of clock cycles to control the first AND gate to generate the second power switch control signal to the input terminal of the oscillator circuit; and
a second protection circuit, coupled to the output terminal of the oscillator circuit and the second power switch control signal, configured to control and protect the clock signal generated by the oscillator circuit according to another signal edge of the clock signal and the second power switch control signal.

2. The oscillator apparatus of claim 1, wherein the oscillator circuit is a ring oscillator circuit.

3. The oscillator apparatus of claim 1, wherein the first counting circuit comprises:
a first inverter, coupled to the clock signal, to generate an inverted clock signal; and
a plurality of first serial connected flip-flops, have an input terminal coupled to the first power switch control signal, a plurality of clock terminals coupled to the first inverter, and an output terminal coupled to the first AND gate;
the plurality of first serial connected flip-flops are triggered to send latched information when the inverted clock signal indicates a switching from the low logic level to the high logic level.

4. The oscillator apparatus of claim 1, wherein the second protection circuit comprises:
a second counting circuit, coupled to the output terminal of the oscillator circuit and the second power switch control signal; and
a second AND gate, having two input terminals respectively connected to the output terminal of the oscillator circuit to receive the clock signal and the output terminal of the second counting circuit;
wherein when the clock signal indicates a switching from a high logic level to a low logic level, the second counting circuit is arranged to output the second power switch control signal to the second AND gate after counting a specific number of clock cycles to control the second AND gate to generate the clock signal.

5. The oscillator apparatus of claim 4, wherein the second counting circuit comprises:
a second inverter, coupled to the clock signal, to generate an inverted clock signal; and
a plurality of second serially connected flip-flops, having an input terminal coupled to the second power switch control signal, a plurality of clock terminals coupled to the second inverter, and an output terminal coupled to the second AND gate; the plurality of second serially connected flip-flops are trigger to send latched information when the inverted clock signal indicates a switching from the low logic level to the high logic level.

6. An oscillator apparatus, comprising:
an oscillator circuit, having an input terminal and an output terminal, configured to generate a first clock signal at the output terminal;
a first AND gate, having a first input terminal coupled to the output terminal of the oscillator circuit to receive the first clock signal, a second input terminal, and an output terminal; and
a protection circuit, coupled to the output terminal of the oscillator circuit and the second input terminal of the first AND gate, configured to generate and output a third power switch control signal to the second input terminal of the first AND gate according to a signal edge of the first clock signal and a first power switch control signal, to control the first AND gate to generate a second clock signal as an output clock of the oscillator apparatus; the protection circuit is further used for generating and outputting a second power switch control signal to the input terminal of the oscillator circuit according to the signal edge of the first clock signal and the first power switch control signal, to protect a circuit element within the oscillator circuit to generate the first clock signal.

7. The oscillator apparatus of claim 6, wherein the second protection circuit comprises:
a counting circuit, coupled to the output terminal of the oscillator circuit and the first power switch control signal; and
a second AND gate, having two input terminals respectively connected to the first power switch control signal and an output terminal of the counting circuit;
wherein when the first clock signal indicates a switching from a high logic level to a low logic level, the counting circuit is arranged to generate and output the third power switch control signal to the first AND gate and the second AND gate after counting a specific number of clock cycles, to control the first AND gate to generate the second clock signal and control the second AND gate to generate the second power switch control signal to the input terminal of the oscillator circuit.

* * * * *